United States Patent [19]
Kasai et al.

[11] Patent Number: 5,968,692
[45] Date of Patent: Oct. 19, 1999

[54] INTEGRATED CIRCUIT PATTERN LITHOGRAPHY METHOD CAPABLE OF REDUCING THE NUMBER OF SHOTS IN PARTIAL BATCH EXPOSURE

[75] Inventors: Naoki Kasai; Takashi Sakoh, both of Tokyo, Japan

[73] Assignee: NEC Corporation, Tokyo, Japan

[21] Appl. No.: 09/039,003

[22] Filed: Mar. 13, 1998

[30] Foreign Application Priority Data

Mar. 14, 1997 [JP] Japan .................................... 9-060846

[51] Int. Cl.$^6$ ....................................................... G03F 9/00
[52] U.S. Cl. .................................................. 430/30; 430/5
[58] Field of Search ................................. 430/5, 30, 296

Primary Examiner—Christopher G. Young
Attorney, Agent, or Firm—Scully, Scott, Murphy & Presser

[57] ABSTRACT

An integrated circuit pattern lithography system comprises a repeat unit candidate generating section of extracting a repeat pattern area and further extracting pattern data and array data of a minimum unit of repeated patterns in the repeat pattern area, for generating repeat unit candidates formed by the array of a plurality of the minimum repeat units, a repeat unit deciding section for deciding a repeat unit to be arrayed in the whole repeat pattern area, from the generated repeat unit candidate group, and a cell projection mask manufacturing section for manufacturing a cell projection mask for use in partial batch exposure in the repeat pattern area, correspondingly to the decided repeat unit.

5 Claims, 14 Drawing Sheets

(a)

102 MINIMUM REPEAT UNIT
101 REPEAT PATTERN AREA (b)

102 MINIMUM REPEAT UNIT
103 DESIGN PATTERN (a)

102　　　　　　　　　104　　　　　　　　101
MINIMUM REPEAT UNIT　　REPEAT UNIT　　REPEAT
　　　　　　　　　　　　　　　　　　　PATTERN AREA (b)

(a)

101 REPEAT PATTERN AREA
102 MINIMUM REPEAT UNIT
106 REPEAT UNIT
107 REMAINING AREA (b)

103 DESIGN PATTERN
106 MAXIMUM REPEAT UNIT
105 ALLOWED SIZE (a)

110 SECOND INTERMEDIATE REPEAT UNIT
109 FIRST INTERMEDIATE REPEAT UNIT
101 REPEAT PATTERN AREA
106 MAXIMUM REPEAT UNIT (b) 110 SECOND INTERMEDIATE REPEAT UNIT
103 DESIGN PATTERN (c) 109 FIRST INTERMEDIATE REPEAT UNIT
103 DESIGN PATTERN (a)

211 INTEGRATED CIRCUIT CHIP
201 REPEAT PATTERN AREA
213 IRREGULAR PATTERN AREA (b)

202 MINIMUM REPEAT UNIT
201 REPEAT PATTERN AREA (c)

203 DESIGN PATTERN
202 MINIMUM REPEAT UNIT
205 ALLOWED SIZE

INTEGRATED CIRCUIT PATTERN LITHOGRAPHY METHOD CAPABLE OF REDUCING THE NUMBER OF SHOTS IN PARTIAL BATCH EXPOSURE

BACKGROUNDS OF THE INVENTION

1. Field of the Invention

The present invention relates to an integrated circuit pattern lithography system and its method for forming pattern data of an integrated circuit, and more particularly to an integrated circuit pattern lithography system and its method capable of improving in throughput by forming patterns at once partially in an area where the same patterns are repeatedly formed through charged particle beam exposure with a preliminary transparent mask.

2. Description of the Related Art

Recently, circuit patterns are getting finer and finer in order to realize large scale integration in the manufacturing technique of a semiconductor device. A pattern exposure system with an electron beam or the other charged particle beam which can form finer patterns is being used instead of the conventional optical pattern exposure. In the optical pattern exposure system, a mask with a pattern of an integrated circuit chip formed on a quartz glass is made and a given area is exposed at once with this mask, so to form integrated circuit patterns on a semiconductor substrate, thereby featuring high throughput. On the contrary, the charged particle beam exposure system is unable to do a batch exposure of chip patterns, differently from the optical pattern exposure system, but it is formed each pattern in a way of direct writing a line in every pattern, or, what is called, with a single stroke of the brush. Therefore, according as an integrated circuit becomes larger scale integration and the patterns to be formed are more increased in number, it takes much more time to be formed patterns on the whole chips, thereby deteriorating the throughput.

Then, proposed is an exposure system having a mask with a plurality of transparent holes for forming a repeat pattern unit (hereinafter, referred to as a cell projection mask) as illustrated in FIG. 13(a), by the use of the characteristic that many of the basic circuits are formed by the repeat of the same pattern in the case where an integrated circuit chip 211 is an integrated circuit chip including a semiconductor memory. The exposure system performs pattern forming by exposing a repeat pattern area 201 of FIG. 13(a) to a charged particle beam through a cell projection mask. In an irregular pattern area 213, patterns are formed in the conventional forming method with a single stroke of the brush. In these ways, it can shorten the direct writing time extremely on the whole as well as improve in throughput.

Design data of the repeat pattern area 201 in a semiconductor integrated circuit is formed by expansion of the minimum repeat units 202 in array, as illustrated in FIG. 13(b). The size of the minimum repeat unit 202 depending on a chip, the description will be made, by way of example, in the case of 1 Gb (gigabit) DRAM (Dynamic Random Access Memory). The most typical area as the repeat pattern area of DRAM is a memory cell array area. In the case of 1 Gb DRAM, there exist about one billion memory cells. Some of these memory cells gather in an array to form the repeat pattern area 201, and the respective repeat pattern areas 201 are dispersedly disposed on the chip.

The size of one memory cell for use in 1 Gb DRAM is about 0.8 $\mu$m×0.4 $\mu$m. In order to form the design data of the repeat pattern area 201, the minimum repeat unit 202 is formed by four (=2×2) memory cells and the minimum repeat units 202 are expanded in array. Namely, the size of the minimum repeat unit 202 is about 1.6 $\mu$m×0.8 $\mu$m. The allowed size 205 of the cell projection mask for use in the partial batch exposure method is generally about 5 $\mu$m×5 $\mu$m. Therefore, since the size of the minimum repeat unit 202 is smaller than the allowed size 205 of the cell projection mask as illustrated in FIG. 13(c), the same minimum repeat unit 202 may be used as the cell projection mask. As a result, the repeat pattern area 201 has an expansion array of the minimum repeat units 202 in 16 rows and 32 columns as illustrated in FIG. 13(b). If the cell projection exposure method may adopt a cell projection mask all based on the minimum repeat units 202, every pattern could be generated by the exposure of "512" (=16×32) shots.

The design pattern 203 illustrated within the minimum repeat unit 202 of FIG. 13(c) is one example of a pattern for forming a field and one minimum repeat unit 202 includes three design patterns 203 as illustrated. When the design pattern 203 included in the minimum repeat unit 202 is formed by the conventional pattern lithography with a variable rectangular beam, since the design pattern 203 is formed by dividing it into individual five rectangles, the necessary shot number for pattern forming on one minimum repeat unit 202 becomes five. Therefore, in the whole repeat pattern area 201, every pattern can be formed by the number "2560" (=16×32×5) shot exposure. Namely, in the example of FIG. 13(c), the cell projection exposure method can reduce the shot number into one fifth of the conventional variable shaped beam exposure method, thereby improving in throughput. Since one part of the design pattern 203 illustrated in FIG. 13(c) is sequential between both adjacent minimum repeat units 202 in a horizontal direction, strictly speaking, the shot number by the conventional variable shaped beam exposure method would be not more than five times as many as the number of the repeat units 202. However, for brevity's sake, the description hereinafter will be made on the assumption that the number of the exposure shots by the conventional variable shaped beam exposure method would be five times as many as the number of the repeat units 202.

This conventional method, however, cannot make effective use of the allowed size 205 and insufficient to the improvement in throughput, because the size of the minimum repeat unit 202 is extremely smaller than the allowed size 205 of the cell projection mask.

In order to improve the throughput more effectively, it is considered that the repeat unit is fixed at the larger size than the minimum repeat unit 202. With reference to FIG. 14, the improving method will be described. FIG. 14(b) shows a maximum repeat unit 206 as the repeat unit for use in the cell projection mask, in which the minimum repeat units 202 are arrayed as many as possible within the range of the allowed size 205 of the cell projection mask. With reference to FIG. 14(a), the maximum repeat unit 206 for use in the cell projection mask has an expansion array of the minimum repeat units 202 in 3 rows and 6 columns. Therefore, the size of the maximum repeat unit 206 is 4.8 $\mu$m×4.8 $\mu$m.

The repeat pattern area 201 has an array of the minimum repeat units 202 in 16 rows and 32 columns as mentioned above. Therefore, the repeat pattern area 201 has enough size to include the partial batch exposure area 214 formed by an expansion array of the maximum repeat units 206 in 5 rows and 5 columns, as illustrated in FIG. 14(a). As a result, patterns in the range of the partial batch exposure area 214 can be formed with the shot number "25" by use of the cell projection mask of the maximum repeat unit 206.

However, there remains an area where the maximum repeat units 206 cannot be expanded, within the repeat pattern area 201, as illustrated. The remaining area is in the size for 62 (=16×32−18×25) minimum repeat units 202 in this example. Then, the conventional variable shaped beam exposure method is adopted to the remaining area, as the variable shaped beam exposure area 215, in order to form the design pattern 203 there.

This operation, however, cannot reduce a sufficient number of shots. More specifically, the shot number becomes "310" (=62×5) in the remaining area for the data processing as the variable shaped beam exposure area 215. The total shot number becomes "335". As mentioned above, the shot number in the partial batch exposure area 214 can be enormously reduced, while the shot number in the variable shaped beam exposure area 215, however, becomes twelfth times or more than the shot number in the partial batch exposure area 214, which is not a sufficient reduction although the shot number is reduced compared with the case of the minimum repeat units used for the cell projection mask.

Since two types of exposure methods, partial batch exposure and variable shaped beam exposure, are used in order to form the design patterns 203 in the whole repeat pattern area 201, the pattern shape and position of the partial batch exposure area 214 is completely different from the pattern shape and position of the variable shaped beam exposure area 215. When the shape and position differs in the exposure pattern in the repeat pattern area 201, the characteristics of the individual semiconductor devices to be formed by these patterns also differ from each other. As a result, reliability and yield of the integrated circuit would be deteriorated.

SUMMARY OF THE INVENTION

An object of the present invention is to provide an integrated circuit pattern lithography system and its method capable of improving in throughput by reducing the shot number more by effective use of the cell projection exposure method.

Another object of the present invention is to provide an integrated circuit pattern lithography system and its method capable of improving in reliability and yield of an integrated circuit by making the pattern shape and the position uniform.

According to the first aspect of the invention, an integrated circuit pattern lithography system for forming pattern data of an integrated circuit through exposure with a charged particle beam, comprises repeat unit candidate generating means extracting a repeat pattern area to be formed by the same repeated patterns, from the pattern data, based on design data of the integrated circuit, and further extracting pattern data and array data of the minimum unit of the repeated patterns in the repeat pattern area, for generating repeat unit candidates formed by the array of a plurality of the minimum repeat units, repeat unit deciding means for deciding a single repeat unit or a plurality of repeat units for covering the whole repeat pattern area, from the repeat unit candidate group generated by said repeat unit candidate generating means, and cell projection mask manufacturing means for manufacturing a cell projection mask for use in partial batch exposure for the repeat pattern area, correspondingly to the repeat unit decided by said repeat unit deciding means.

The repeat unit candidate generating means may generate a repeat unit so that the array number of the minimum repeat units in the repeat pattern area can be divisible by the array number of the minimum repeat units within the same repeat unit.

The repeat unit candidate generating means may generate a repeat unit so that the array number of the minimum repeat units in the repeat pattern area can be divisible by the array number of the minimum repeat units within the same repeat unit, and the repeat unit deciding means may decide, as the repeat unit, such a repeat unit candidate as is of the largest size within the size allowed to form the cell projection mask, out of the repeat unit candidate group generated by said repeat unit candidate generating means.

In the preferred construction, said repeat unit deciding means decides, as a first repeat unit, such a repeat unit candidate as is of the largest size within the size allowed to form the cell projection mask, out of the repeat unit candidate group generated by said repeat unit candidate generating means, and decides, as a second repeat unit, such a repeat unit candidate having the size capable of being arrayed in the remaining area if there leaves a remaining area after the array of the first repeat units and having a proper shape lest it should leave a remaining area where the repeat unit cannot be arrayed, and said cell projection mask manufacturing means manufactures a plurality of cell projection masks corresponding to the first and second repeat units.

In another preferred construction, said repeat unit deciding means decides the second repeat units of several types corresponding to the shape of the remaining area.

According to the second aspect of the invention, a pattern lithography method for forming pattern data of an integrated circuit through exposure with a charged particle beam, comprising the steps of:

a step of extracting a repeat pattern area to be formed by the same repeated patterns, from the pattern data, based on design data of the integrated circuit;

a step of extracting pattern data and array data of the minimum unit of the repeated patterns in the repeat pattern area;

a step of generating repeat unit candidates formed by the array of a plurality of the minimum repeat units, based on the pattern data and the array data;

a step of deciding a single repeat unit or a plurality of repeat units for covering the whole repeat pattern area, from the repeat unit candidate group generated by said repeat unit candidate generating step; and a step of manufacturing a cell projection mask for use in partial batch exposure for the repeat pattern area, correspondingly to the repeat unit decided by said repeat unit deciding step.

The repeat unit candidate generating step may generate a repeat unit so that the array number of the minimum repeat units in the repeat pattern area can be divisible by the array number of the minimum repeat units within the same repeat unit.

In the preferred construction, said repeat unit candidate generating step generates a repeat unit so that the array number of the minimum repeat units in the repeat pattern area can be divisible by the array number of the minimum repeat units within the same repeat unit, and said repeat unit deciding step decides, as the repeat unit, such a repeat unit candidate as is of the largest size within the size allowed to form the cell projection mask, out of the repeat unit candidate group generated by said repeat unit candidate generating step.

In the preferred construction, said repeat unit deciding step includes a step of deciding, as a first repeat unit, such a repeat unit candidate as is of the largest size within the size allowed to form the cell projection mask, out of the repeat unit candidate group generated by said repeat unit candidate generating step, and a step of deciding, as a second repeat unit, such a repeat unit candidate having the size capable of being arrayed in the remaining area if there leaves a remaining area after the array of the first repeat units and having a proper shape lest it should leave a remaining area where the repeat unit cannot be arrayed.

In another preferred construction, said repeat unit deciding step includes a step of deciding, as a first repeat unit, such a repeat unit candidate as is of the largest size within the size allowed to form the cell projection mask, out of the repeat unit candidate group generated by said repeat unit candidate generating step, and a step of deciding, as a second repeat unit, such a repeat unit candidate having the size capable of being arrayed in the remaining area if there leaves a remaining area after the array of the first repeat units and having a proper shape lest it should leave a remaining area where the repeat unit cannot be arrayed, a step of deciding, as a third repeat unit, such a repeat unit candidate that the array number of the minimum repeat units in the repeat pattern area can be divisible by the array number of the minimum repeat units within the same repeat unit candidate, and that is of the largest size within the size allowed to form the cell projection mask, out of the repeat unit candidate group generated by said repeat unit candidate generating step; and further includes, between said repeat unit deciding step and said cell projection mask manufacturing step, a step of making a comparison between the array number of the repeat units in the repeat pattern area with the first and second repeat unit and the array number of the repeat units in the repeat pattern area with the third repeat unit and selecting the repeat pattern having the smaller number.

According to the third aspect of the invention, a computer readable memory storing a control program for controlling an integrated circuit pattern lithography system for forming pattern data of an integrated circuit through exposure with a charged particle beam, the control program comprising the steps of:

a step of extracting a repeat pattern area to be formed by the same repeated patterns, from the pattern data, based on design data of the integrated circuit;

a step of extracting pattern data and array data of the minimum unit of the repeated patterns in the repeat pattern area;

a step of generating repeat unit candidates formed by the array of a plurality of minimum repeat units, based on the pattern data and the array data;

a step of deciding a single repeat unit or a plurality of repeat units for covering the whole repeat pattern area, from the repeat unit candidate group generated by said repeat unit candidate generating step; and a step of manufacturing a cell projection mask for use in partial batch exposure for the repeat pattern area, correspondingly to the repeat unit decided by said repeat unit deciding step.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
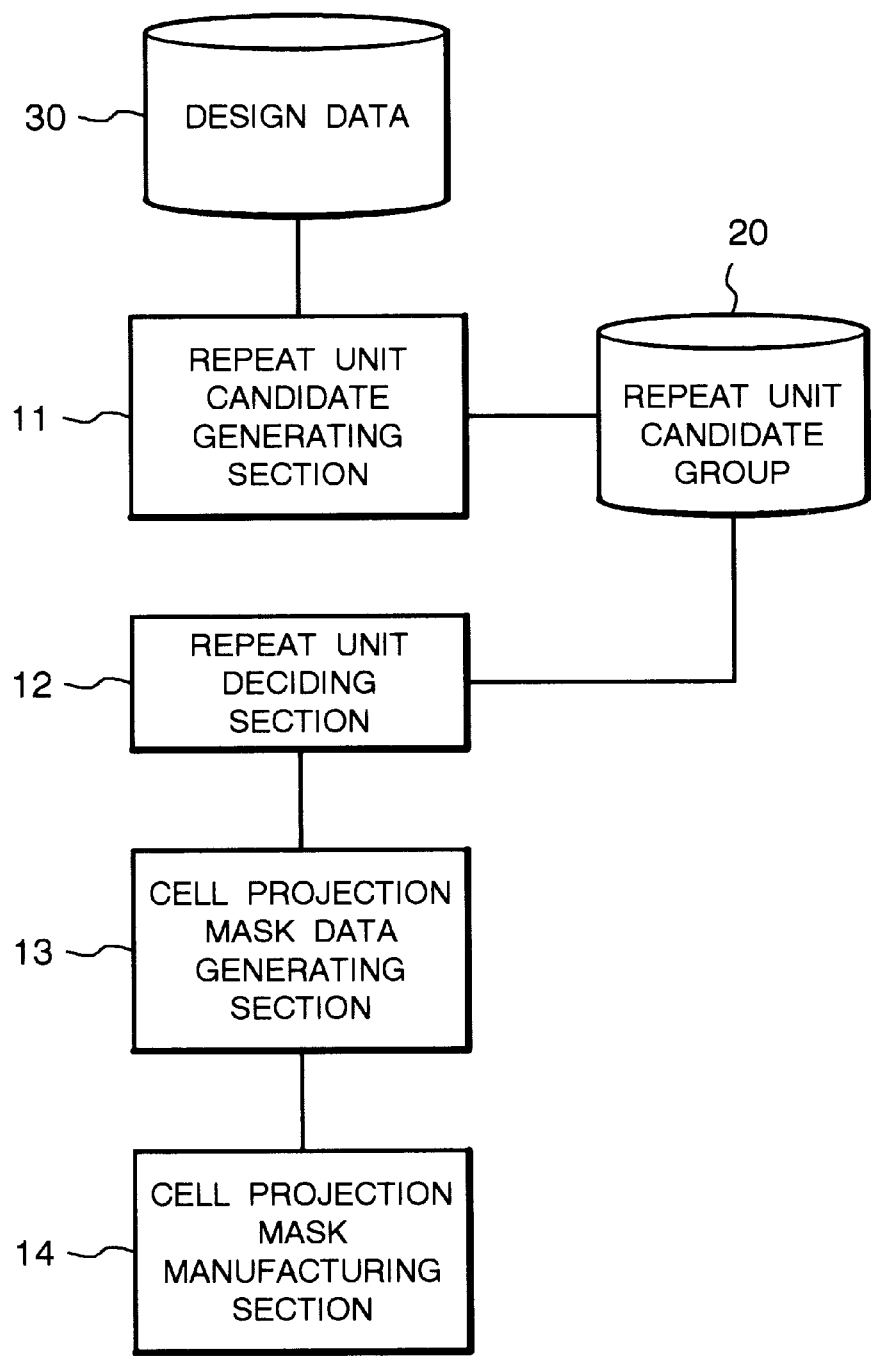
FIG. 1 is a block diagram showing an integrated circuit pattern lithography system according to a first embodiment of the present invention.
Figure 2:
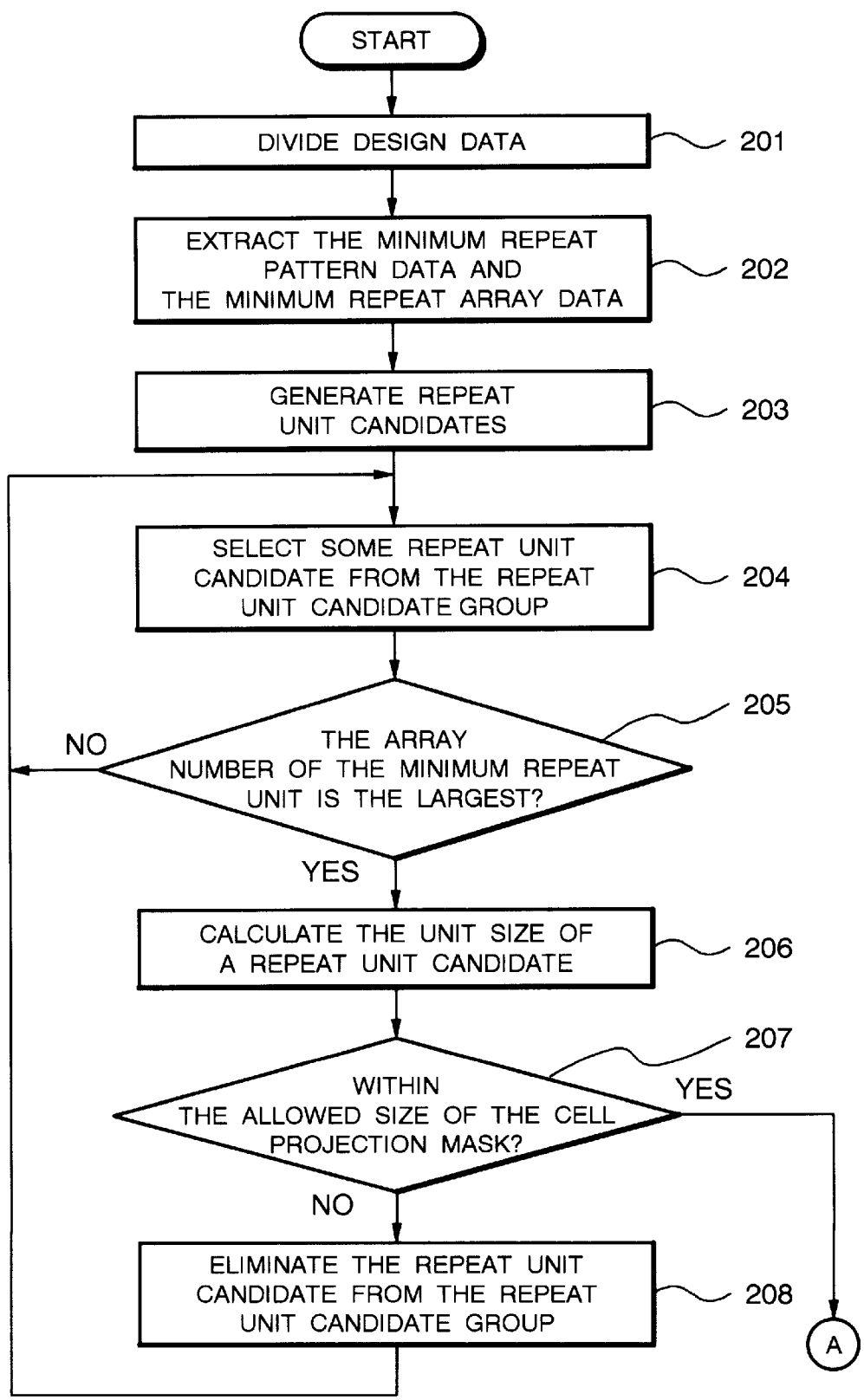
FIG. 2 is a flow chart showing an operation of the first embodiment.
Figure 3:
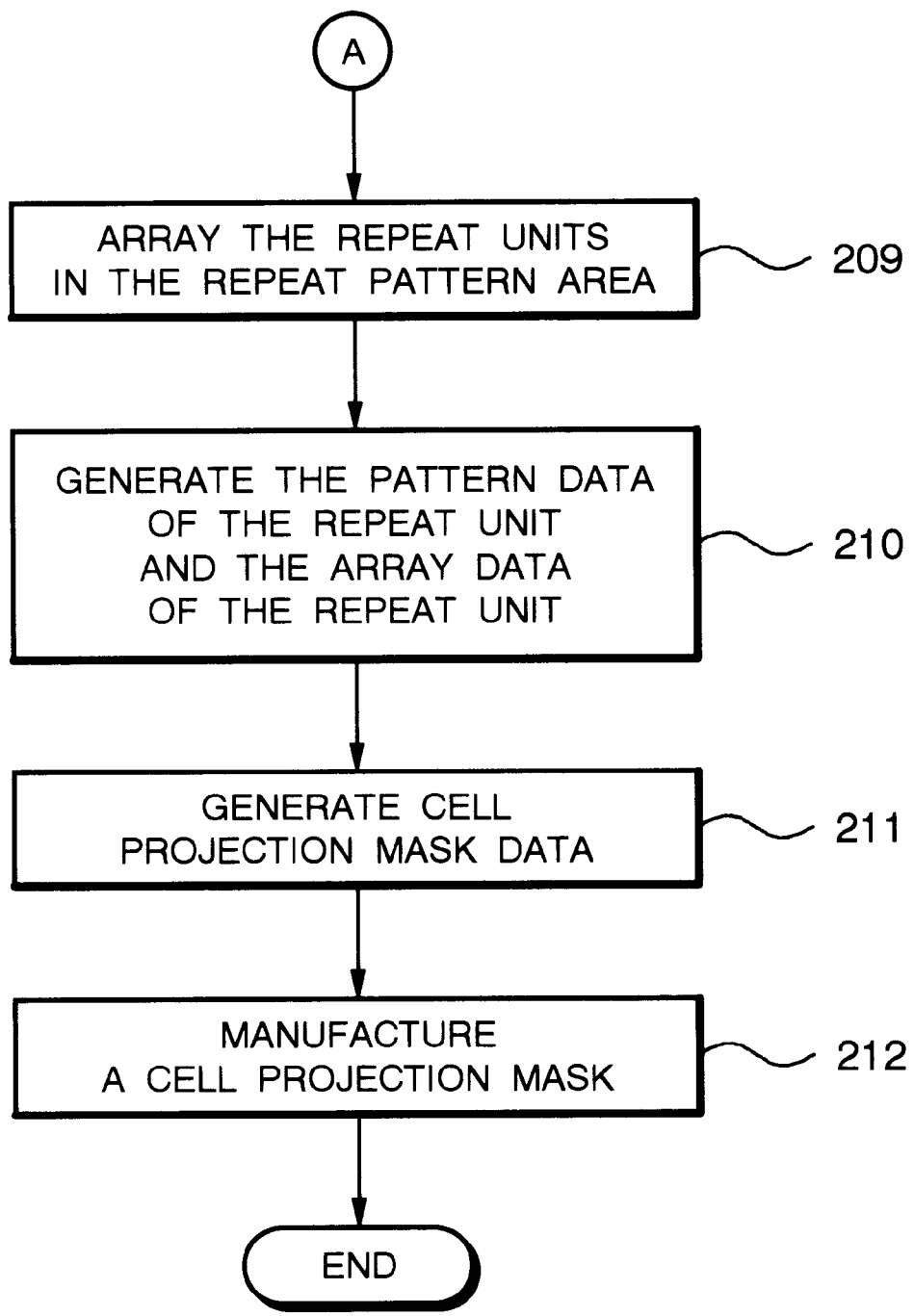
FIG. 3 is a flow chart showing an operation of the first embodiment.
Figure 4:
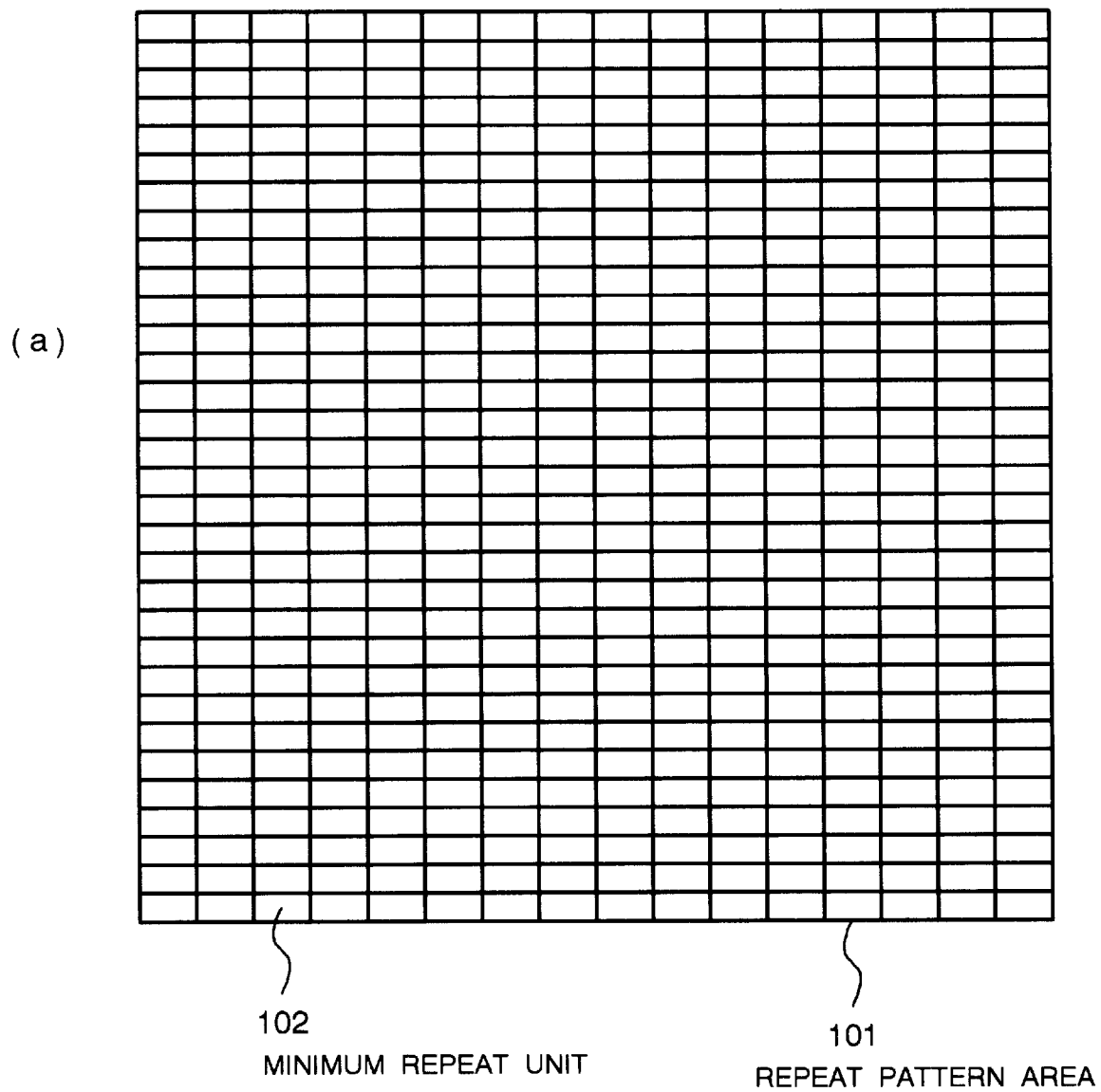
FIG. 4 is a view showing an example of the design data of a repeat pattern area in the first embodiment.
Figure 4:
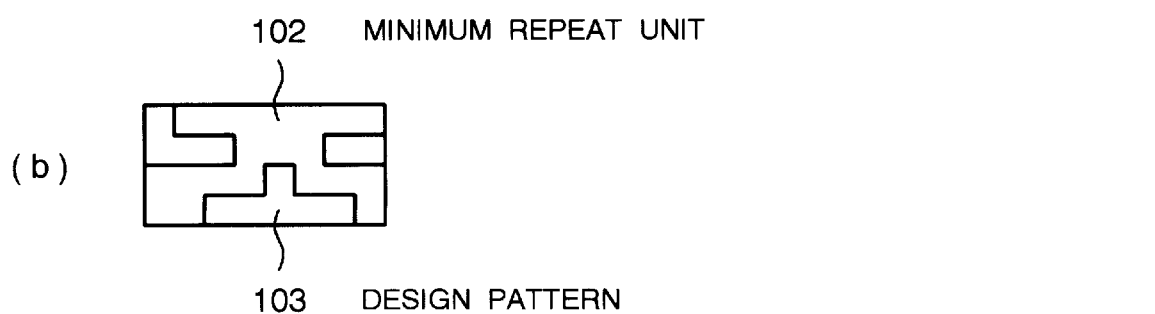
Figure 5:
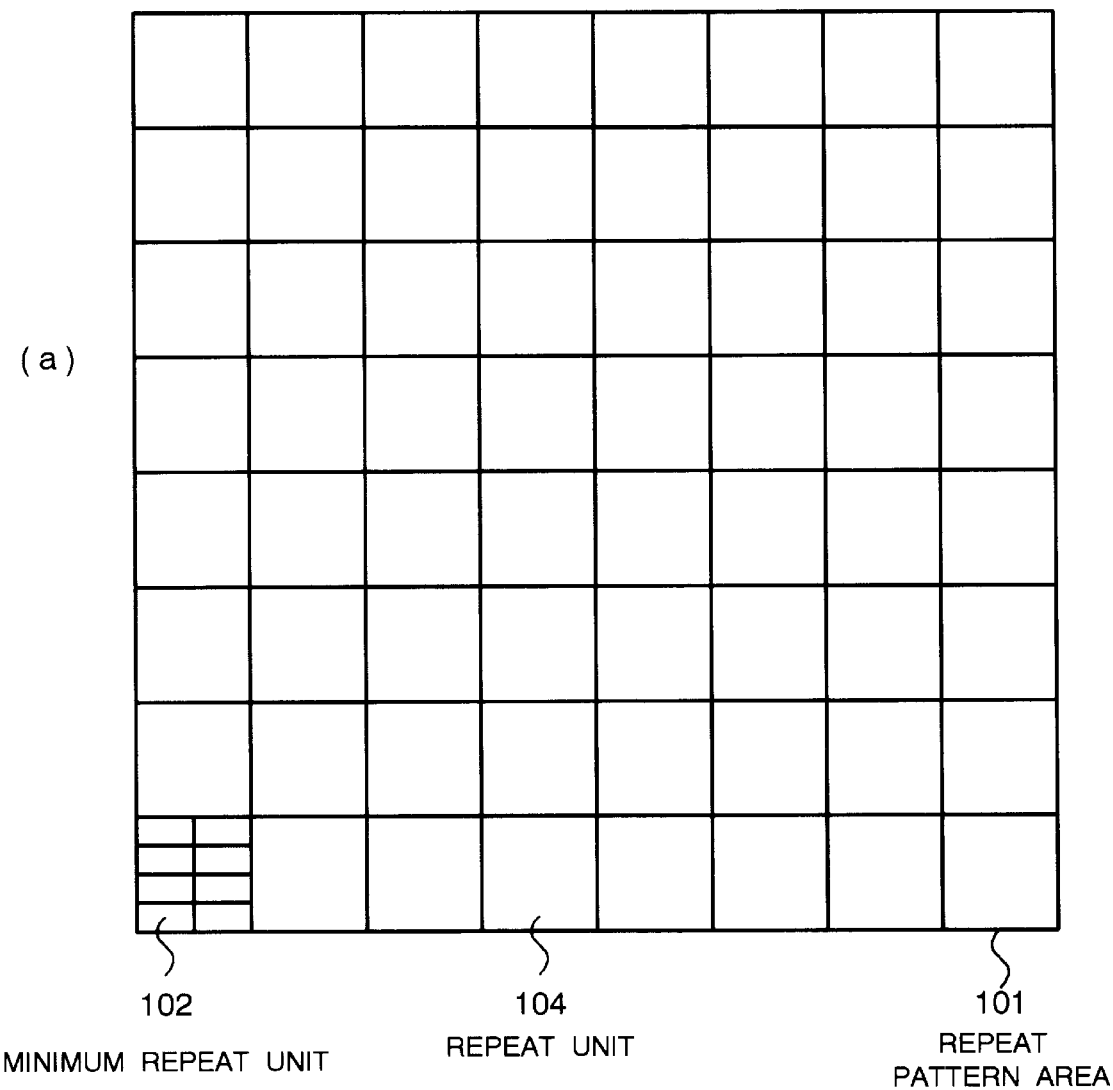
FIG. 5 is a view showing a constitution of the repeat pattern area in the first embodiment.
Figure 5:
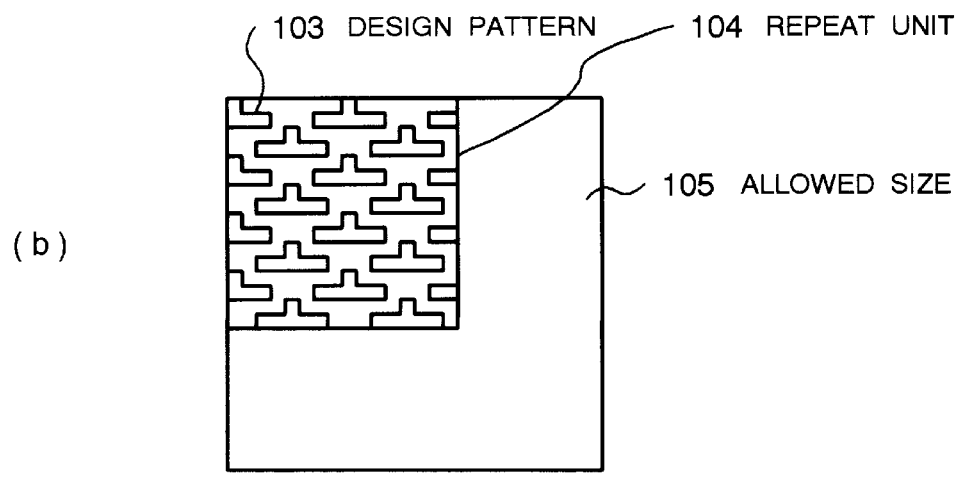

FIG. 1 is a block diagram showing a constitution of an integrated circuit pattern lithography system according to a first embodiment of the present invention. FIGS. 2 and 3 are flow charts each showing an operation of pattern data forming processing according to the embodiment. FIG. 4 is a view showing an example of design data for a repeat pattern area according to the embodiment, and FIG. 5 is a view showing a constitution of the repeat pattern area in the embodiment.

With reference to FIG. 1, the integrated circuit pattern lithography system of the embodiment comprises a repeat unit candidate generating section 11 for generating candidates for repeat unit after receiving design data 30 for integrated circuit patterns, a repeat unit deciding section 12 for selecting a desired sized repeat unit from the repeat unit candidate group 20 generated by the repeat unit candidate generating section 11 to decide the repeat unit for use in the pattern data forming, a cell projection mask data generating section 13 for generating cell projection mask data based on the repeat unit decided by the repeat unit deciding section 12, and a cell projection mask manufacturing section 14 for manufacturing a cell projection mask based on the cell projection mask data generated by the cell projection mask data generating section 13. FIG. 1 shows only the characteristic components of the embodiment, and the description of other general components is omitted there.

Each component of the embodiment may be realized by a program-controlled CPU and an internal memory such as a RAM or the like in a work station or the other computer system. The computer program for controlling a CPU is provided, stored in a storing medium such as a magnetic disk, a semiconductor memory, or the like, and it is loaded in a computer system.

In the embodiment, the repeat unit candidate generating section 11 receives the design data 30 for the integrated circuit patterns and divides it into variable shaped beam exposure data which is irregular and partial batch array exposure data having an array of the same repeat patterns. From the partial batch array exposure data, derived are data for deciding the pattern shape and the position within a minimum repeat unit (hereinafter, referred to as minimum repeat unit pattern data) and data for deciding the array and the position for forming the partial batch exposure area by the minimum repeat pattern data (hereinafter, referred to as minimum repeat unit array data). FIG. 4 is a view for use in describing their relationship clearly. With reference to FIG. 4(a), the repeat pattern area 101 has an array of the minimum repeat units 102. With reference to FIG. 4(b), the design pattern 103 is disposed within the minimum repeat unit 102.

The repeat unit candidate generating section 11 generates repeat unit candidates which are respectively integer times as large as the minimum repeat unit, based on the derived minimum repeat unit pattern data and the minimum repeat unit array data. More specifically, referring to FIG. 4, the array number of the minimum repeat units 102 in rows and columns is checked, in the repeat pattern area 101 of FIG. 4(a). The array number N1 of the minimum repeat units 102 in rows is "16", and the array number M1 thereof in columns is "32". Assuming that the divisor of the array number N1 in rows of the minimum repeat units 102 in the repeat pattern area 101 is defined as n1 and the divisor of the array number M1 in columns thereof is defined as m1, generated are repeat unit candidates having the minimum repeat units 102 arrayed by the combination (the number of the minimum repeat units in rows, the number of the minimum repeat units in columns)=(n1, m1). Where, n1 is a natural number so that N1/n1 may become a natural number and m1 is a natural number so that M1/m1 may become a natural number. In the example of FIG. 2, n1=1, 2, 4, 8, 16, and M1=1, 2, 4, 8, 16, 32. Namely, since the number of n1 is five and the number of m1 is six, the number of the repeat unit candidates to be generated is 30 (=5×6).

The repeat unit deciding section 12 selects such a repeat unit candidate as will be smaller than the size allowed to form a cell projection mask and may have the greatest number of the minimum repeat units 102, from the repeat unit candidate group 20 generated by the repeat unit candidate generating section 11 and decides it as the repeat unit in this processing. The same repeat unit candidates are arrayed in the repeat pattern area 101. Thus, the repeat unit candidates each having the smaller area than the size allowed to form a cell projection mask and having the largest repeat unit area are arrayed in the repeat pattern area 101.

FIG. 5(a) is a view showing the state in which the repeat units 104 selected by the repeat unit deciding section 12 are arrayed in the repeat pattern area 101. FIG. 5(b) shows the shape and the position of the design pattern 103 inside of the selected repeat unit 104 within the size 105 allowed to form a cell projection mask. The allowed size 105 of the cell projection mask is, for example, 5 $\mu$m×5 $\mu$m. Assuming that the number of the minimum repeat units 102 in rows and in columns is respectively defined as n2 and m2 in the repeat unit 104, n2=N1/n1 and m2=M1/m1. In the example of FIG. 3, n1=8, m1=8, n2=2, and m2=4. In these ways, the design pattern 103 in the repeat pattern area 101 can be formed by only the array of the selected repeat units 104.

The cell projection mask data generating section 13 generates the pattern data and the array data of the repeat unit 104 decided by the repeat unit deciding section 12. It generates the cell projection mask data based on the generated pattern data of the repeat unit 104.

The cell projection mask manufacturing section 14 manufactures a cell projection mask, based on the cell projection mask data generated by the cell projection mask data generating section 13. The cell projection mask manufactured by the cell projection mask manufacturing section 14 is set in an electron beam exposure system.

With reference to the flow charts of FIG. 2 and FIG. 3, the operation of the integrated circuit pattern lithography system according to the first embodiment will be described. At first, the repeat unit candidate generating section 11, upon receipt of the design data 30, divides it into the irregular variable shaped beam exposure data and the partial batch exposure data (Step 201). From the partial batch exposure data, derived are the minimum repeat unit pattern data and the minimum repeat unit array data (Step 202). The variable shaped beam exposure data is supplied to the electron beam exposure system. Then, repeat unit candidates are generated based on the derived minimum repeat unit pattern data and minimum repeat unit array data (Step 203).

The repeat unit deciding section 12 selects some repeat unit candidate from the repeat unit candidate group 20 (Step 204), and it is judged whether this repeat unit candidate has the largest number of the minimum repeat units (refer to the reference numeral 102 in FIG. 4) in the repeat unit candidate group 20 (Step 205). If the repeat unit candidate does not have the largest number of the minimum repeat units, another repeat unit candidate is selected from the repeat unit candidate group 20 and judged similarly. While, if the repeat unit candidate has the largest number of the minimum repeat units, the unit size of the repeat unit candidate is calculated (Step 206), and compared with the allowed size (refer to the reference numeral 105 in FIG. 5) of the cell projection mask (Step 207).

When the unit size of the repeat unit candidate is larger than the allowed size of the cell projection mask, this repeat unit candidate is eliminated from the repeat unit candidate group 20 (Step 208) and the operation returns to Step 204, where the same processing starting from the selecting processing of another repeat unit candidate will be repeated. On the other hand, when the unit size of the repeat unit candidate is smaller than the allowed size of the cell projection mask, the same repeat units (refer to the reference numeral 104 in FIG. 5) are arrayed in the repeat pattern area (refer to the reference numeral 101 in FIG. 5) (Step 209).

This time, the cell projection mask data generating section 13 generates the pattern data and the array data in this repeat unit (Step 210) and generates cell projection mask data, based on the pattern data of the repeat unit (Step 211). The cell projection mask manufacturing section 14 manufactures a cell projection mask based on the cell projection mask data (Step 212).

The electron beam exposure system with the manufactured cell projection mask set thereon performs the electron beam exposure on the material through the cell projection mask, according to the variable shaped beam exposure data derived from the design data 30 by the repeat unit candidate generating section 11 and the array data of the repeat unit generated by the cell projection mask data generating section 13. Through the well-known developing process, integrated circuit patterns are formed on a semiconductor substrate.

As mentioned above, in the embodiment, the repeat pattern area 101 is formed with the array of only the selected repeat units 104 and each repeat unit 104 is exposed at once with the cell projection mask, thereby reducing the number of shots to improve throughput, compared with the conventional art. Further, in the embodiment, every pattern is formed by the partial batch exposure, thereby making the pattern shape and position uniform, to improve reliability and yield of an integrated circuit, compared with the conventional method using a plurality of exposing methods.

Although selected in the embodiment is a repeat unit 104 which is smaller than the allowed size 105 and the largest of the candidate group, it is not restricted to this, but a larger one than the minimum repeat unit 102 could improve the throughput anyway. Although the description has been made with the allowed size 5 μm×5 μm in this embodiment, it is not restricted to this, but a larger allowed size would be preferable if it may be possible in the electron beam exposure system.

Figure 6:
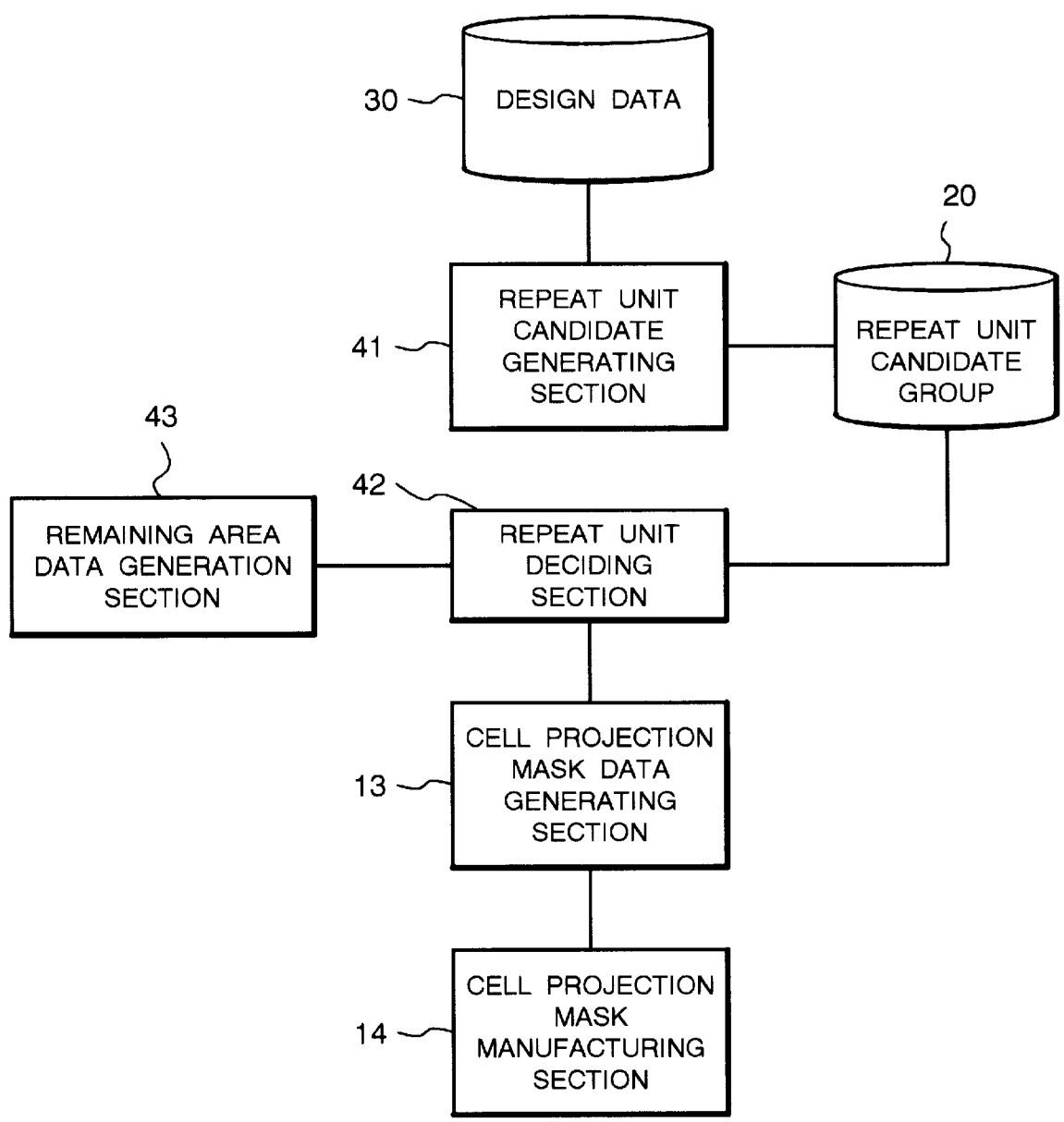
FIG. 6 is a block diagram showing a constitution of an integrated circuit pattern lithography system according to a second embodiment of the present invention.
Figure 7:
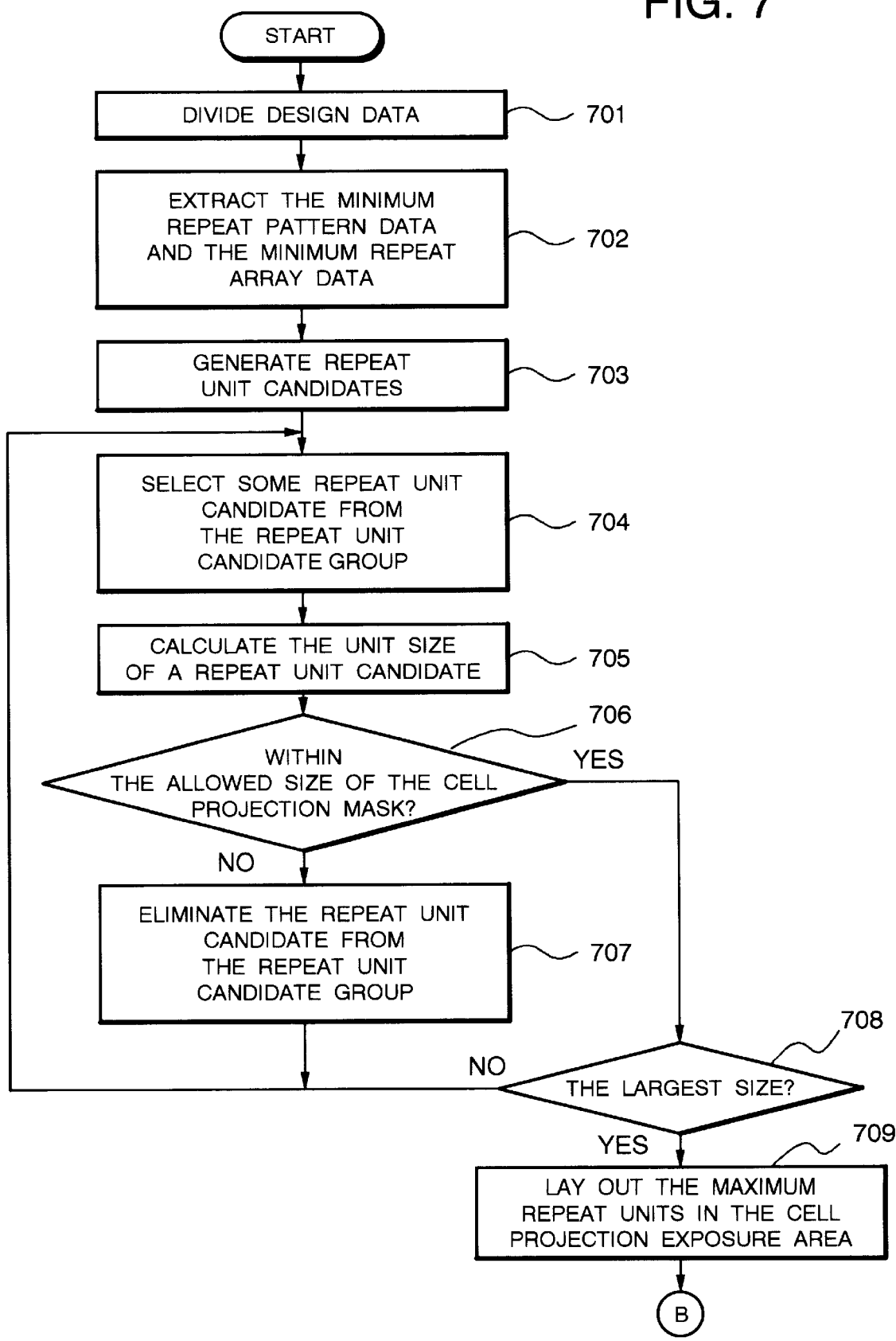
FIG. 7 is a flow chart showing an operation of the second embodiment.
Figure 8:
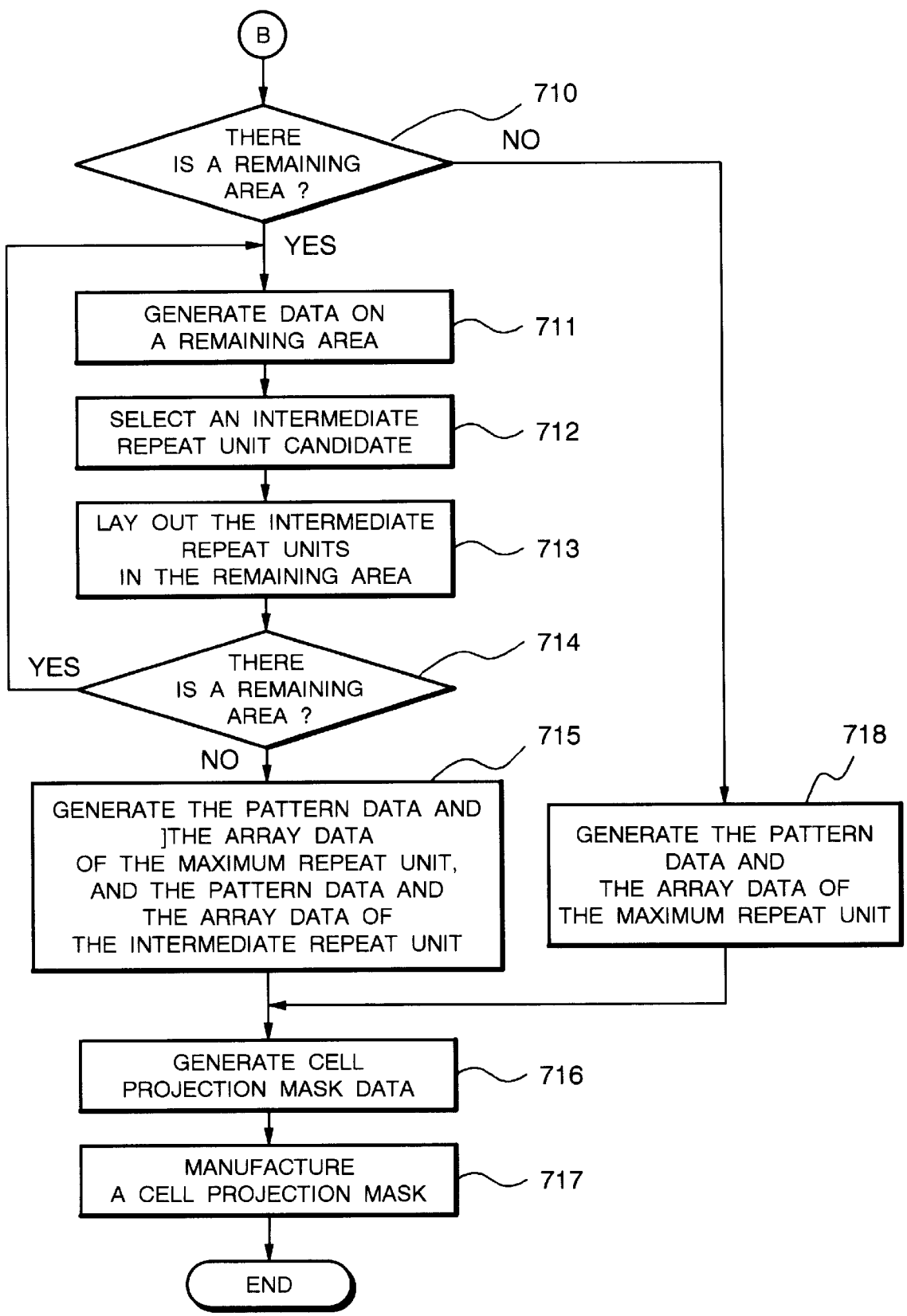
FIG. 8 is a flow chart showing an operation of the second embodiment.
Figure 9:
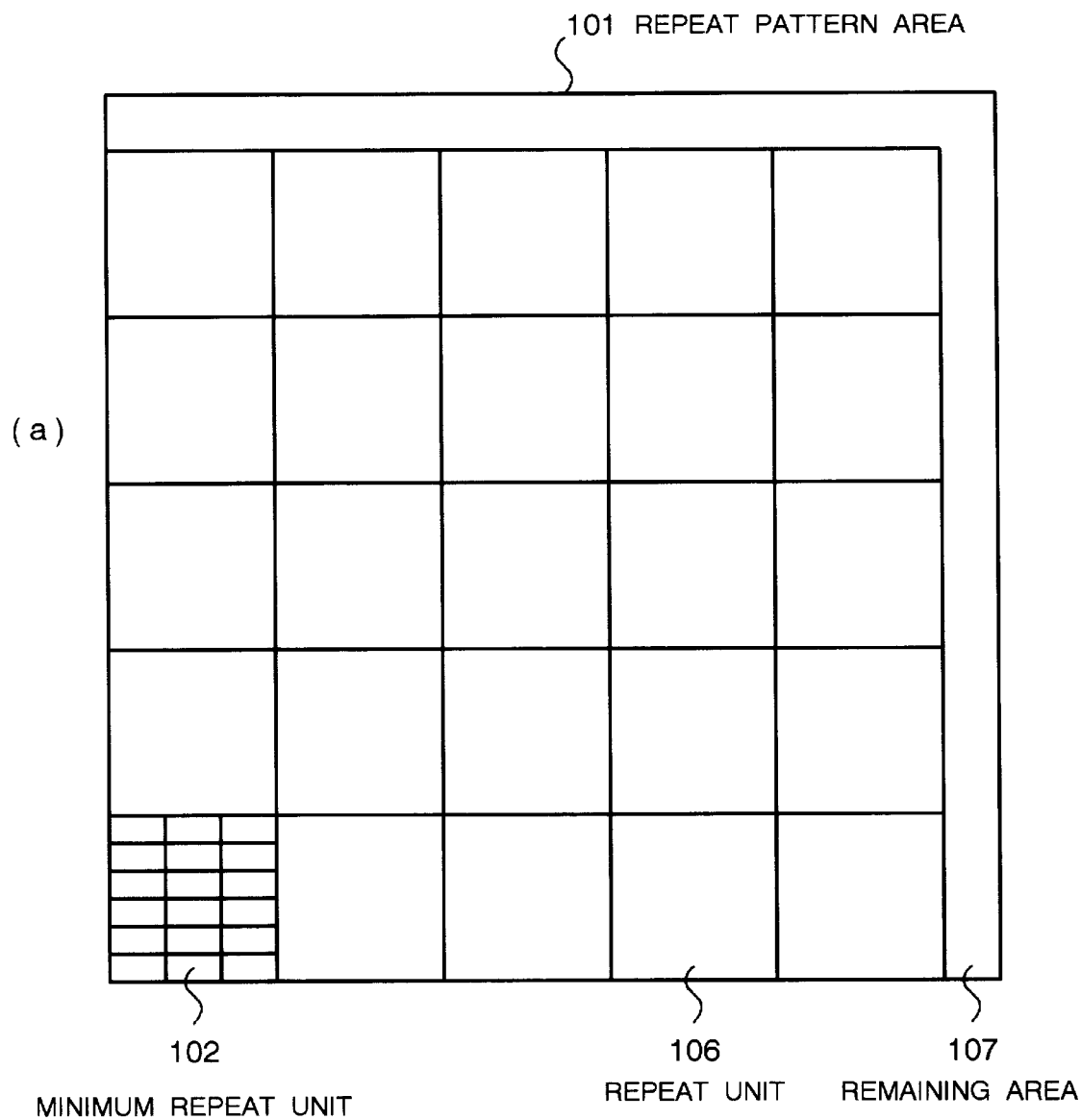
FIG. 9 is a view showing a constitution of a repeat pattern area in the second embodiment.
Figure 9:
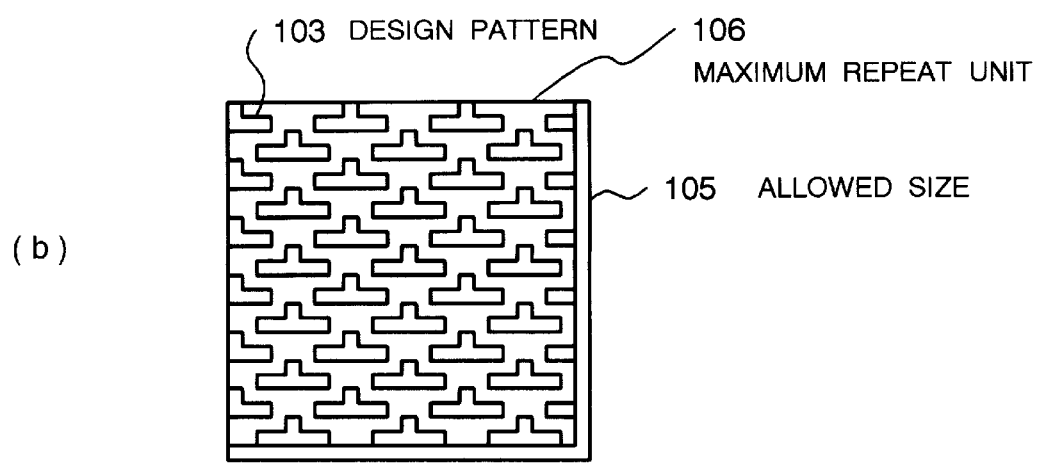
Figure 10:
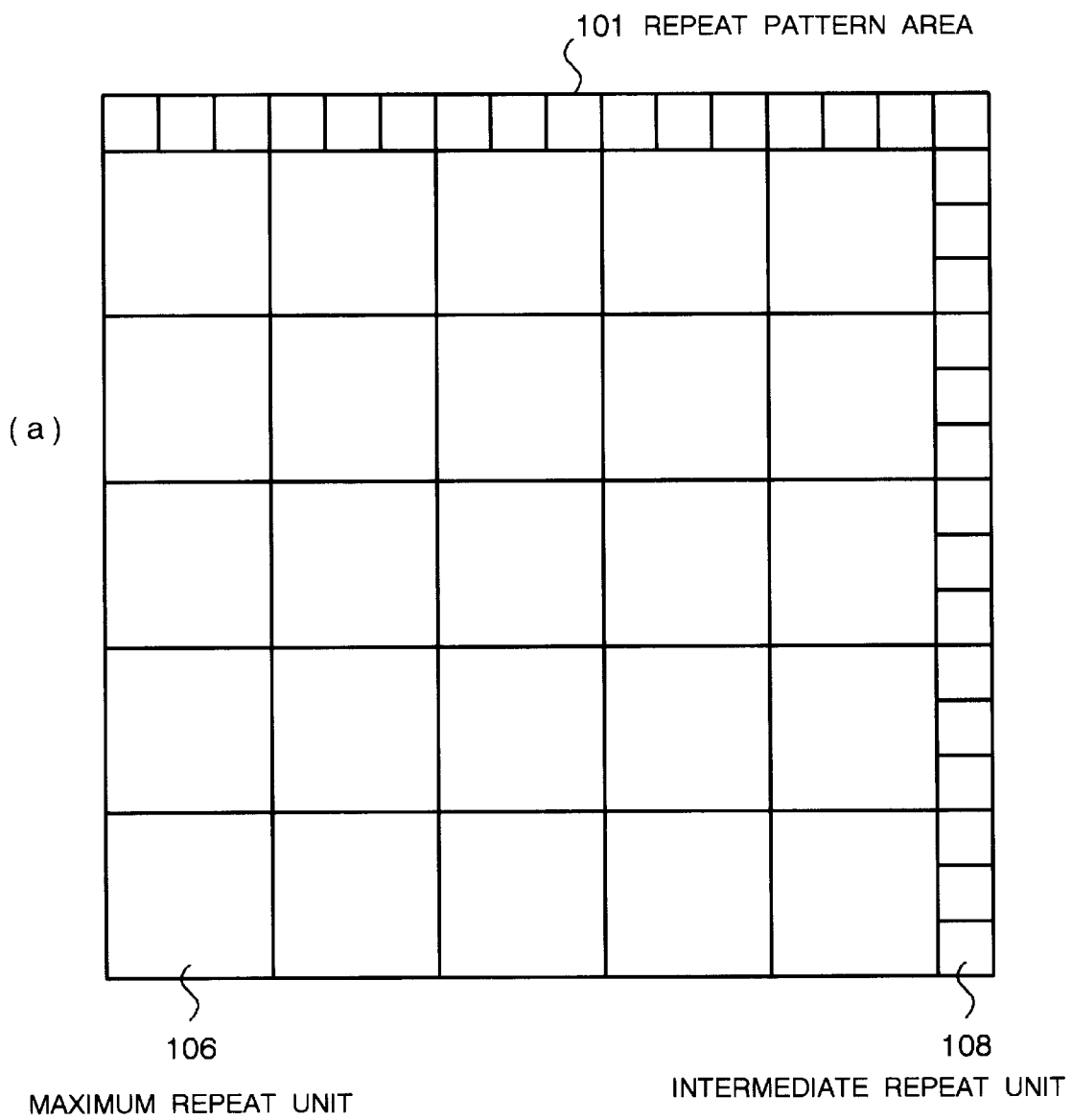
FIG. 10 is a view showing an expansion example of the repeat units in a repeat pattern area according to the second embodiment.
Figure 10:
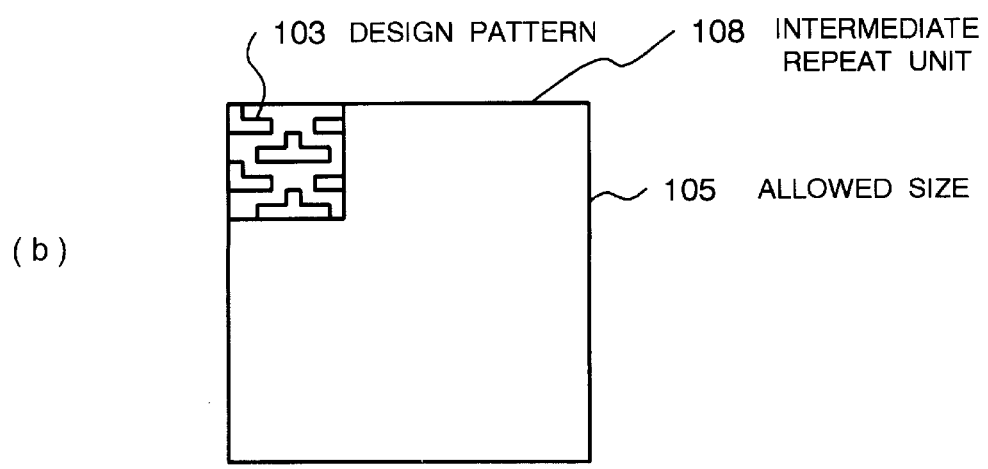
Figure 11:
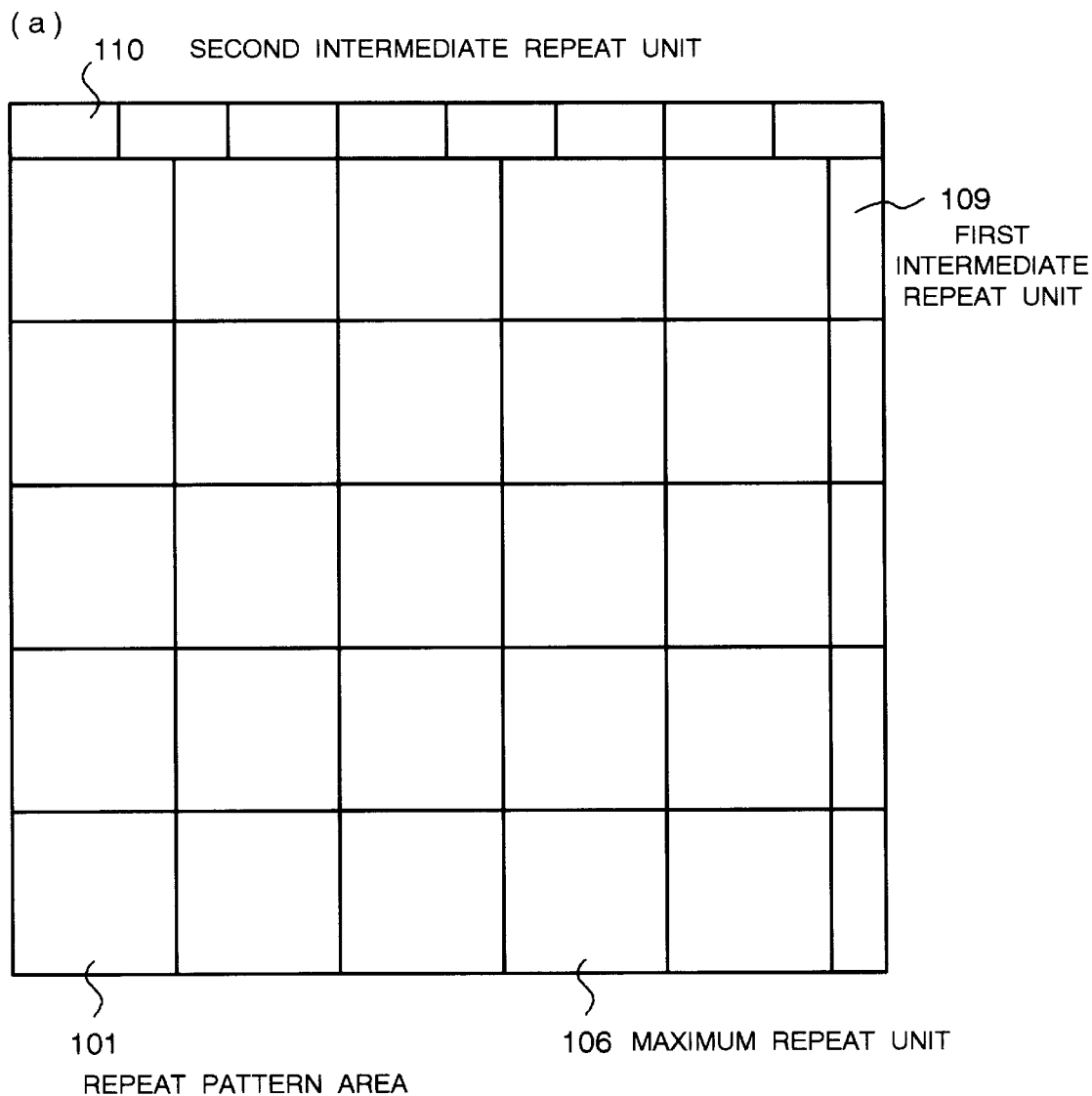
FIG. 11 is a view showing another expansion example of the repeat units in a repeat pattern area according to the second embodiment.
Figure 11:
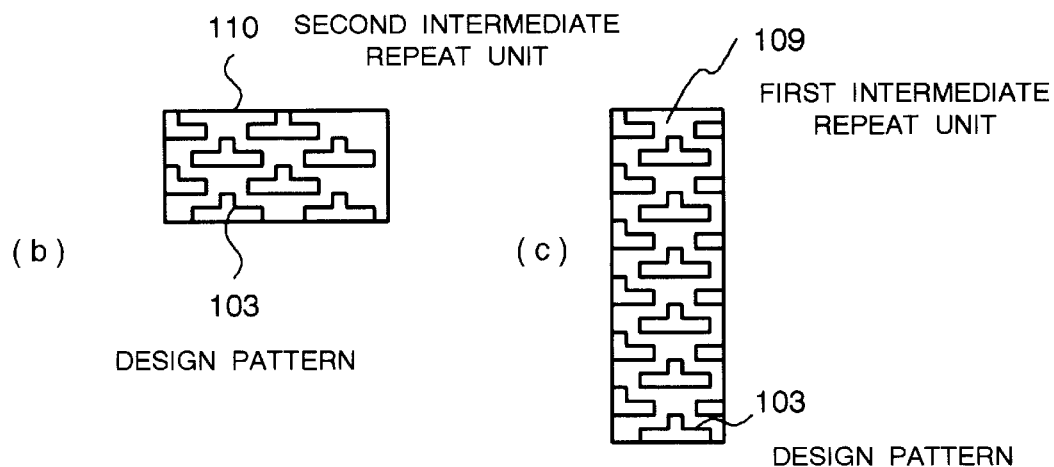

This time, a second embodiment of the present invention will be described. FIG. 6 is a block diagram showing a constitution of an integrated circuit pattern lithography system according to the second embodiment of the present invention. FIGS. 7 and 8 are flow charts each showing an operation of the pattern data forming processing according to the embodiment. FIG. 9 is a view showing a constitution of a repeat pattern area in the embodiment, FIG. 10 is a view of an expansion example of the repeat units in the repeat pattern area in the embodiment, and FIG. 11 is another expansion example of the repeat units in the repeat pattern area in the embodiment.

With reference to FIG. 6, the integrated circuit pattern lithography system of the embodiment comprises a repeat unit candidate generating section 41 for generating candidates for repeat unit after receiving design data 30 for the integrated circuit patterns, a repeat unit deciding section 42 for selecting a desired sized repeat unit from the repeat unit candidate group 20 generated by the repeat unit candidate generating section 41 to decide the repeat unit for use in the pattern data forming, a remaining area data generating section 43 for complementing the processing of the repeat unit deciding section 42, a cell projection mask data generating section 13 for generating cell projection mask data based on the repeat unit decided by the repeat unit deciding section 42, and a cell projection mask manufacturing section 14 for manufacturing a cell projection mask based on the cell projection mask data generated by the cell projection mask data generating section 13. FIG. 6 shows only the characteristic components of the embodiment, and the description of other general components is omitted there.

Of the above components, since the cell projection mask data generating section 13 and the cell projection mask manufacturing section 14 are the same components as the first embodiment illustrated in FIG. 1, the description thereof is omitted, with the same reference numerals attached thereto. Each component of the embodiment may be realized by a program-controlled CPU and an internal memory such as a RAM or the like in a work station or the other computer system, similarly to the first embodiment.

In the embodiment, the repeat unit candidate generating section 41 receives the design data 30 for the integrated circuit patterns and divides it into the variable shaped beam exposure data which is irregular and the partial batch array exposure data having an array of the same repeat patterns. From the partial batch array exposure data, derived are the minimum repeat unit pattern data and the minimum repeat unit array data. The repeat unit candidate generating section 41 generates repeat unit candidates which are respectively integer times as large as the minimum repeat unit, based on the derived minimum repeat unit pattern data and the minimum repeat unit array data.

In the first embodiment, the repeat unit candidate generating section 11 generates repeat unit candidates so that the array number of the minimum repeat units in each repeat unit candidate may be the divisor of the array number of the minimum repeat units in the repeat pattern area. In the second embodiment, however, the array number of the minimum repeat units in each repeat unit candidate must not be necessarily the divisor of the array number of the minimum repeat units in the repeat pattern area. More specifically, assuming that the integer not more than the array number N1 in rows (N1=16 in the example shown in FIG. 4(a)) is defined as n3 and the integer not more than the array number M1 in columns (M1=32 in the example shown in FIG. 4(a)) is defined as m3, in the repeat pattern area 101 of FIG. 9(a), a repeat unit candidate having an array of the minimum repeat units 102 with the combination of (the array number of the repeat unit in rows, the array number of the repeat unit in columns)=(n3, m3) will be generated.

In the embodiment, the repeat unit deciding section 42 selects such a candidate for repeat unit as will have the largest size under the size allowed to form a cell projection mask, from the repeat unit candidate group 20 generated by the repeat unit candidate generating section 41 and decides it as the repeat unit (hereinafter, referred to as the maximum repeat unit) in this processing. The maximum repeat unit candidates are arrayed in the repeat pattern area 101. More specifically, referring to FIG. 9, assuming that the allowed size 105 of the cell projection mask is 5 μm×5 μm and the size of the minimum repeat unit 102 is 1.6 μm×0.8 μm, the array number of the minimum repeat units 102 in the maximum repeat unit 106 becomes (n3, m3)=(3, 6) as illustrated in FIG. 9(a) and (b). The maximum repeat unit 106 has an array of 5 in rows and 5 in columns in the repeat pattern area 101.

As mentioned above, since the array number of the minimum repeat units in the maximum repeat unit is not necessarily the divisor of the array number of the minimum repeat units in the repeat pattern area, the case may occur in which there leaves a remaining area 107 impossible to include the maximum repeat unit 106 in the repeat pattern area 101 as illustrated in FIG. 9(a). In such a case, in order to array repeat units in the remaining area, another repeat unit such as could be arrayed in this area and would not cause a remaining area (hereinafter, referred to as an intermediate repeat unit) is decided from the repeat unit candidate group 20, based on the data relative to the remaining area 107 generated by the remaining area data generating section 43, and the resultant repeat units are arrayed in the remaining area 107.

The remaining area data generating section 43 judges the existence of the remaining area 107 at the time when the repeat unit deciding section 42 disposes the minimum repeat units 106 in the repeat pattern area 101, and if the remaining area 107 exists, the information including the shape and size is extracted to be sent to the repeat unit deciding section 42.

With reference to the flow charts of FIGS. 7 and 8, an operation of the integrated circuit pattern lithography system according to the second embodiment will be described. The operation from Step 701 to Step 703 where repeat unit candidates are generated, by the repeat unit candidate generating section 41, is the same as the operation of the first embodiment as shown in FIGS. 2 and 3. Where, the array number of the minimum repeat unit in each repeat unit candidate generated as mentioned above, is not necessarily the divisor of the array number of the minimum repeat units in the repeat pattern area, differently from the first embodiment.

Some repeat unit candidate is selected from the repeat unit candidate group 20 by the repeat unit deciding section 42 (Step 704), the unit size of the repeat unit candidate is calculated (Step 705) and compared with the allowed size (refer to the reference numeral 105 in FIG. 9) of the cell projection mask (Step 706). When the unit size of the repeat unit candidate is larger than the allowed size of the cell projection mask, this repeat unit candidate is eliminated from the repeat unit candidate group 20 (Step 707), and the operation returns to Step 704, where the same processing starting from the selecting processing of another repeat unit candidate will be repeated.

On the other hand, when the unit size of the repeat unit candidate is smaller than the allowed size of the cell projection mask, it is judged whether the unit size of the repeat unit candidate is the largest of the repeat unit candidate group 20 (Step 708). If the unit size of the repeat unit candidate is not the largest, the operation returns to Step 704 where the same processing starting from the selecting processing of another repeat unit candidate will be repeated. While, if the unit size of the repeat unit candidate is the largest, the same repeat unit candidates are arrayed in the repeat pattern area (refer to the reference numeral 101 in FIG. 9) as the maximum repeat unit (Step 709). The portion where the repeat unit candidates are arrayed in the repeat pattern area, is referred to as the partial batch exposure area.

Next, it is judged whether there leaves any remaining area (refer to the reference numeral 107 in FIG. 9) in the repeat pattern area by the remaining area data generating section 43 (Step 710). When there exists no remaining area, since the above partial batch exposure area and the repeat pattern area are in one accord, the operation moves to the processing by the cell projection mask data generating section 13, where the pattern data and the array data of the maximum repeat unit are generated (Step 718).

On the other hand, when there exists a remaining area, layout of an intermediate repeat unit is performed in order to array the design pattern (refer to the reference numeral 103 in FIG. 9) in the remaining area. More specifically, the data relative to the remaining area is generated by the remaining area data generating section 43 (Step 711), and according to the data relative to the remaining area, the repeat unit deciding section 42 selects some repeat unit candidate which is smaller than the size of the maximum repeat unit 106 and can be arrayed in the remaining area, from the repeat unit candidate group 20, so to array them in the remaining area as the intermediate repeat unit candidate (Steps 712 and 713). Further, it is judged whether there exists any area where the intermediate repeat unit cannot be arrayed (Step 714), and if there exists such an area, this step returns to Step 711, where the selecting processing of another repeat unit candidate will be repeated.

On the other hand, when the intermediate repeat units can be arrayed in the whole remaining area, it moves to the processing by the cell projection mask data generating section 13, where the pattern data and array data of the intermediate unit, and the pattern data and the array data of the maximum repeat unit arrayed in the partial batch exposure area in Step 709 are generated (Step 718).

With reference to FIG. 10(a), the remaining area 107 shown in FIG. 9(a) contains 31 intermediate repeat units 108 respectively formed by vertically connecting two minimum repeat units 102. Namely, the repeat pattern area 101 is to be formed by the expansion of two types of units, the maximum repeat unit 106 and the intermediate repeat unit 108. FIG. 10(b) shows the relationship between the intermediate repeat unit 108 and the allowed size 105 as well as the design pattern within the intermediate repeat unit 108.

Then, the cell projection mask data is generated by the cell projection mask data generating section 13, based on the pattern data of the maximum repeat unit and intermediate repeat unit (Step 716). The cell projection mask based on the cell projection mask data is manufactured by the cell projection mask manufacturing section 14 (Step 717).

Thereafter, an electron beam exposure system with the manufactured cell projection mask set thereon (not illustrated) performs electron beam exposure on the material through the cell projection mask, according to the variable shaped beam exposure data derived from the design data 30 by the repeat unit candidate generating section 41 as well as the array data of the maximum repeat unit and the intermediate repeat unit generated by the cell projection mask data generating section 13. Then, integrated circuit patterns are formed on a semiconductor substrate through the well-known developing process.

As mentioned above, in the embodiment, the repeat pattern area 101 is to be formed by the expansion of the two kinds of repeat units, the maximum repeat unit 106 and the intermediate repeat unit 108. The embodiment, in which these repeat units are exposed at once with the cell projection mask corresponding to the maximum repeat unit and the cell projection mask corresponding to the intermediate repeat unit, can reduce the shot number much more than the conventional art, thereby improving in throughput. Further, the embodiment can make the pattern shape and the position uniform because of every pattern forming by the partial batch exposure, thereby improving in reliability and yield of an integrated circuit compared with the conventional art by use of several types of exposure methods.

In the above operational example of the second embodiment, the repeat unit to be arrayed in the remaining area is defined as one kind of intermediate repeat unit 108 of the same size. However, a plurality of kinds of intermediate repeat units may be arrayed in the remaining area. For example, in Step 712 of the flow chart of FIG. 8, a first intermediate repeat unit 109 may be selected which includes the same number of the minimum repeat units 102 as the maximum repeat unit 106 in a vertical direction and includes the corresponding number of the minimum repeat units 102 depending on the size of the remaining area in a horizontal direction, as illustrated in FIG. 11(a), and in Step 713, five first intermediate repeat units 109 are arrayed at the right end of the remaining area 107. Passing through Steps 714 and 711, in Step 712, a second intermediate repeat unit 110 having a proper size corresponding to the size of the remaining area may be selected, and in Step 713, eight second intermediate repeat units 110 are arrayed in the top end of the remaining area 107.

In these ways, the present embodiment constitutes the repeat pattern area 101 by the expansion of three kinds of repeat units in total, the maximum repeat unit 106, the first intermediate repeat unit 109, and the second intermediate repeat unit 110.

In the embodiment, though the maximum repeat units 106 are first arrayed in the repeat pattern area 101, the order of array is not restricted to this order, but a repeat unit smaller than the maximum repeat unit may be arrayed first. In the embodiment, though two or three kinds of cell projection masks are used in order to form every pattern in one repeat pattern area, four or more kinds of cell projection masks may be used as long as the number thereof is less than the number of kinds of patterns to be formed on the cell projection mask. Further, in the embodiment, though the intermediate repeat unit larger than the minimum repeat unit 102 is used as the repeat unit to be arrayed in the remaining area 107, the minimum repeat unit 102 may be used as the intermediate repeat unit.

Figure 12:
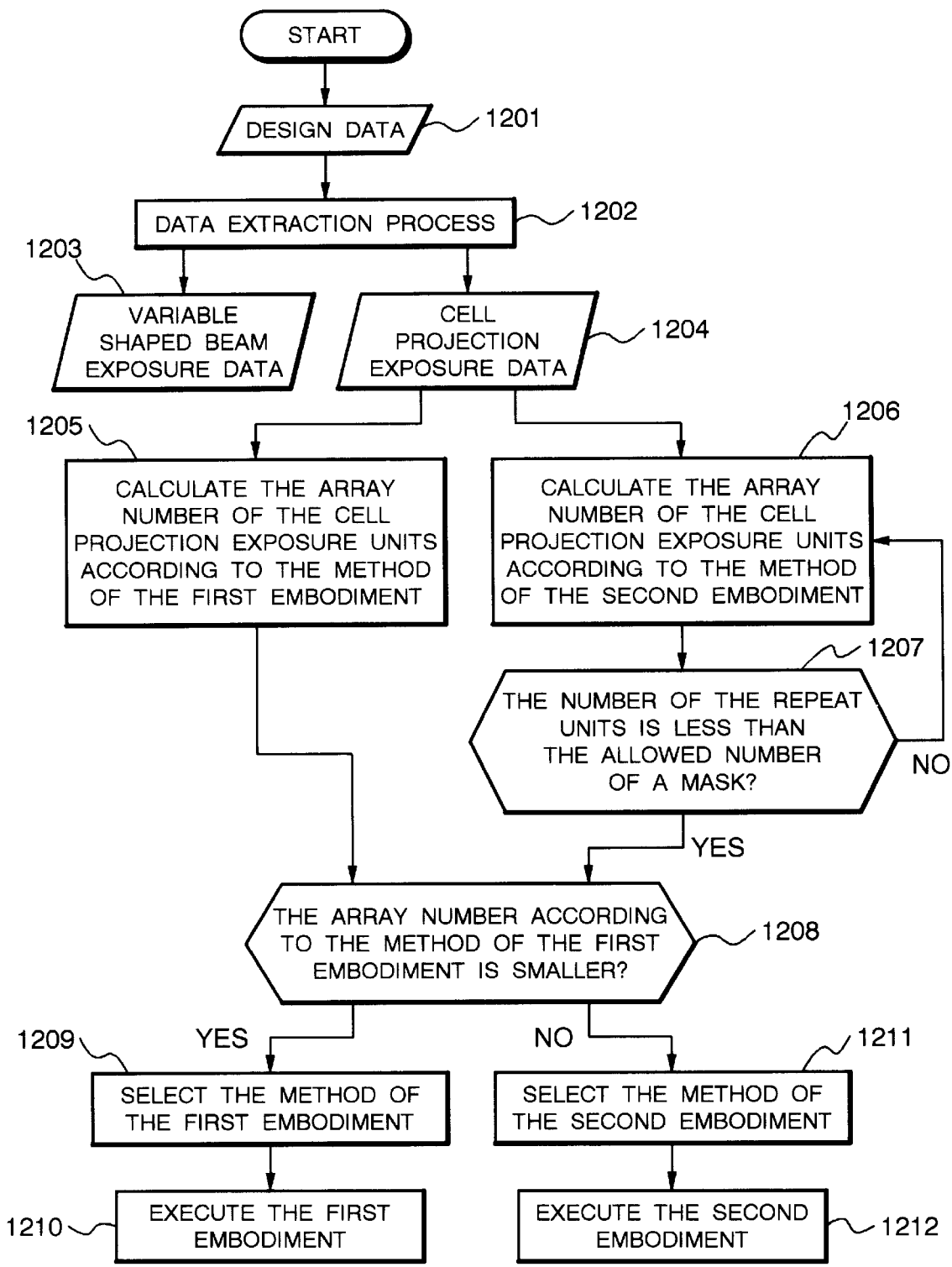
FIG. 12 is a view showing the procedure of selectively executing either embodiment of the first and the second ones after their simulation.
Figure 13:
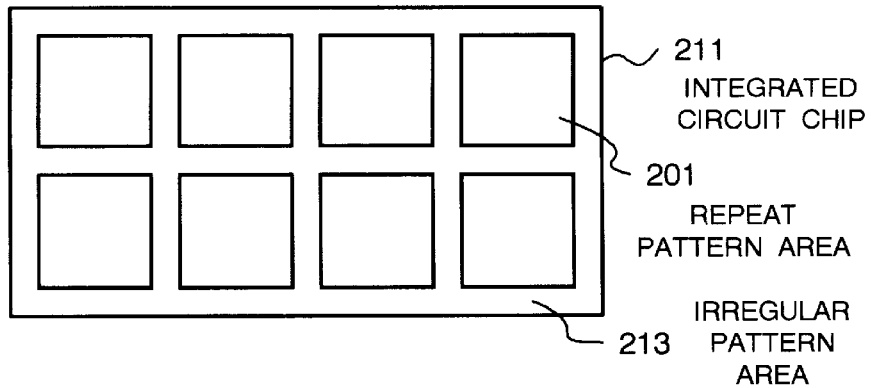
FIG. 13 is a view showing design data of the conventional integrated circuit chip.
Figure 13:
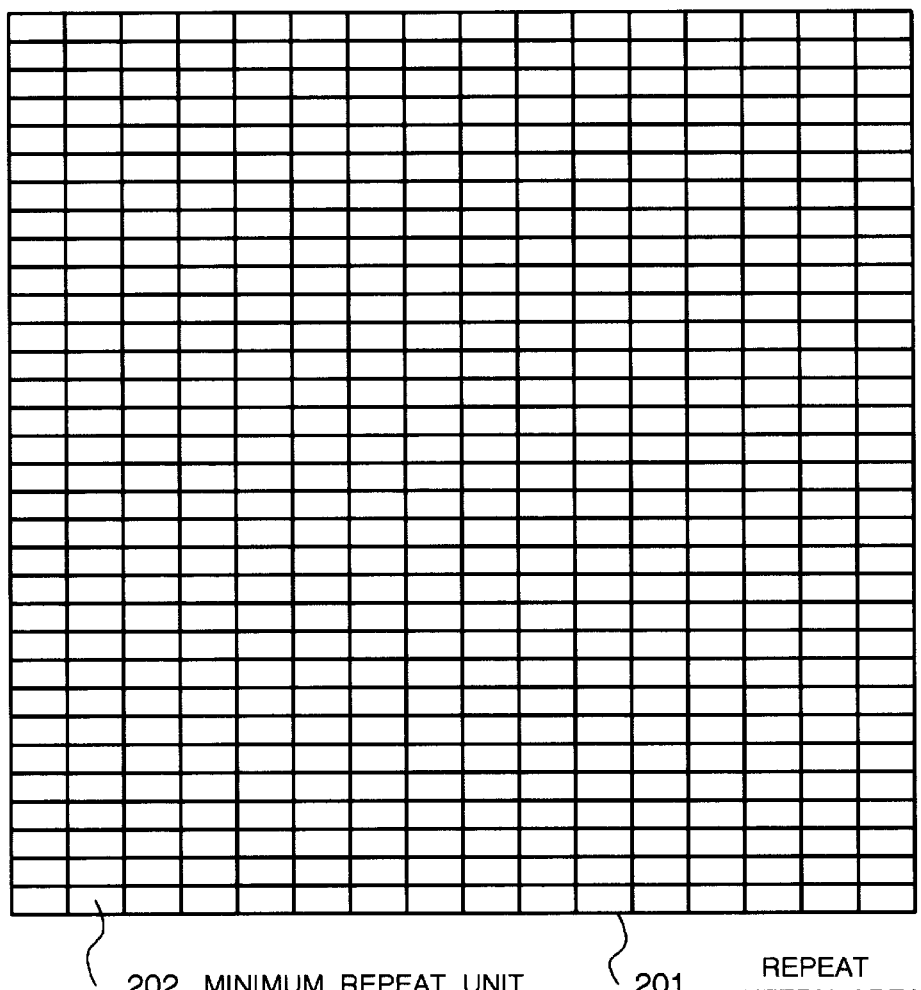
Figure 13:
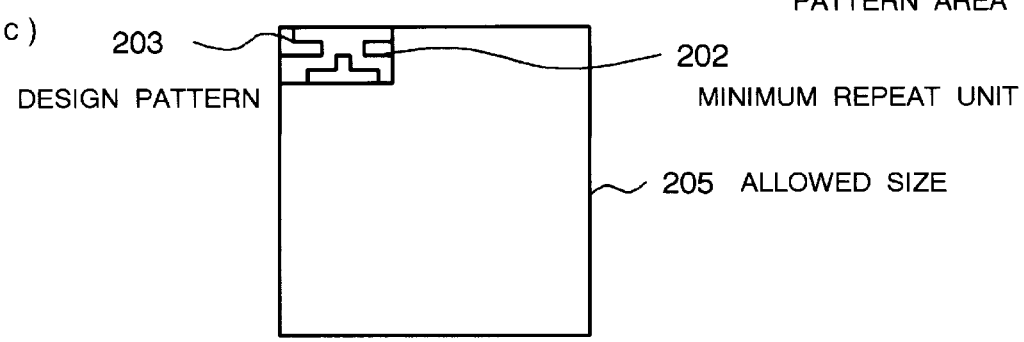
Figure 14:
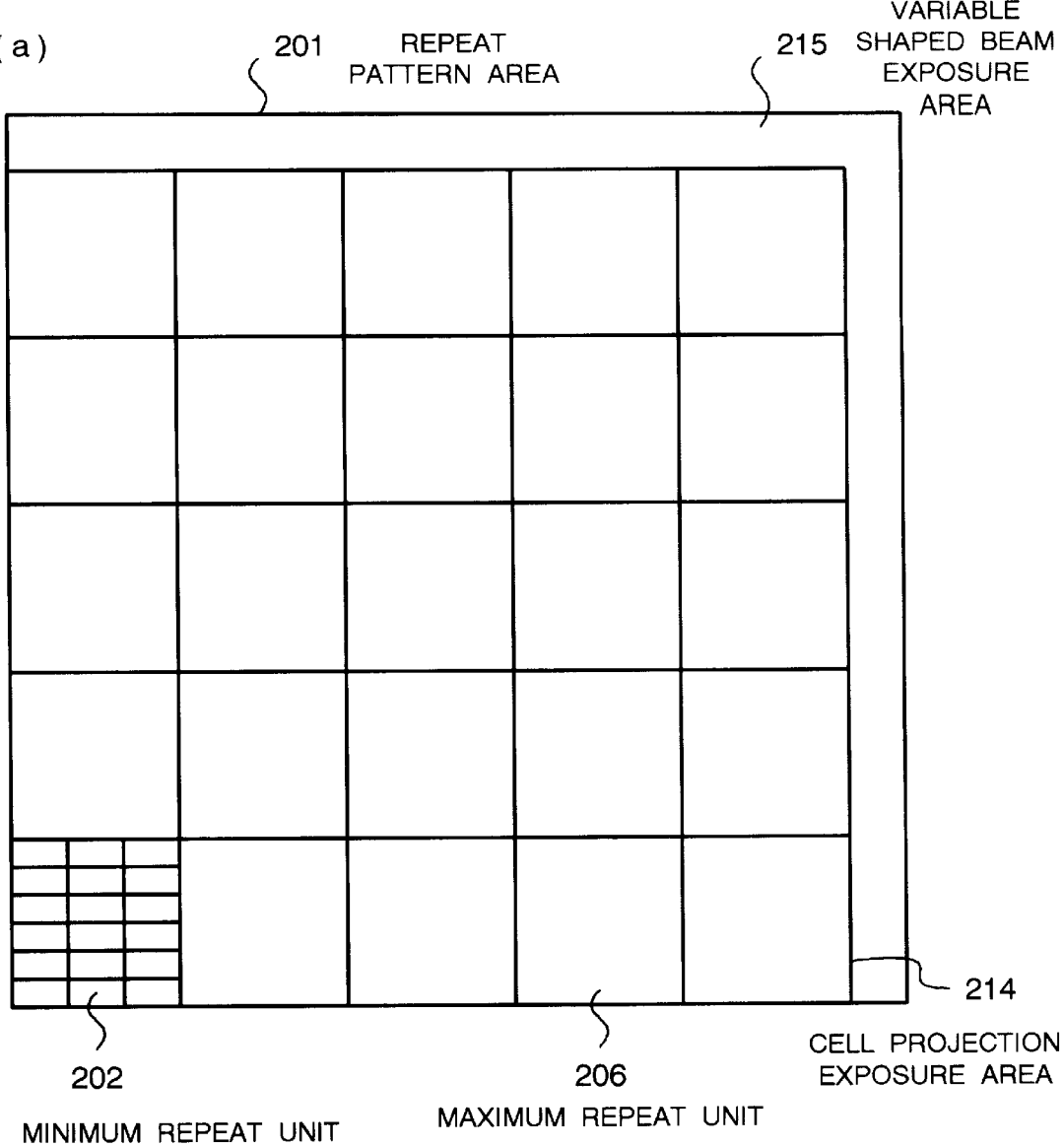
FIG. 14 is a view showing the state in which the design data is expanded in the repeat pattern area of the conventional integrated circuit chip.
Figure 14:
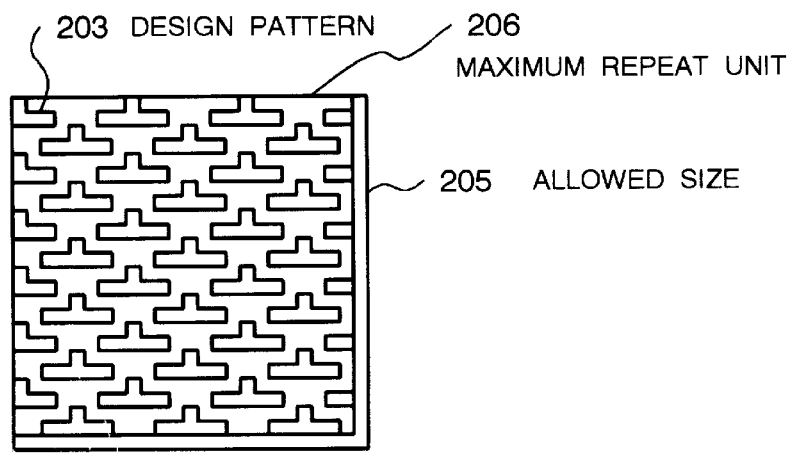

The first embodiment and the second embodiment have been described in the above. Further, after simulation of the first embodiment and the second embodiment, it is possible to select and execute better one for improving in throughput of the two. With reference to FIG. 12, the description will be made more specifically. First, the design data 1201 is divided into variable shaped beam exposure data 1203 and partial batch exposure data 1204. As for the partial batch exposure data 1204, the array number of the partial batch exposure units (repeat unit 104) according to the operation described in the first embodiment and the array number of the partial batch exposure units (the maximum repeat unit 106 and the intermediate repeat units 108, 109, and 110) according to the operation described in the second embodiment are calculated (Steps 1205 and 1206). When the array number of the partial batch exposure units according to the second embodiment is more than the number allowed to be formed on the cell projection mask, repeat unit is reexamined so as to lessen the kind of repeat units and the array number of the partial batch exposure units are calculated again (Steps 1207 and 1206).

Next, the array number of the partial batch exposure units in the first embodiment is compared with the array number of the partial batch exposure units in the second embodiment (Step 1208), and when the array number of the partial batch exposure units in the first embodiment is smaller, the first embodiment is selected (Step 1209) and the cell projection mask is manufactured, to do exposure with it (Step 1210). On the other hand, when the array number of the partial batch exposure units in the second embodiment is smaller, the second embodiment is selected (Step 1211) and the cell projection mask is manufactured, to do exposure with it (Step 1212).

In the above operation, either embodiment including the smaller array number of the partial batch exposure units, in the first embodiment and the second embodiment, can be selected, thereby reducing the shot number much more, to improve in throughput.

In each embodiment as mentioned above, pattern data forming as for one repeat pattern area of an integrated circuit chip has been described. Needless to say, each embodiment of the present invention can be adopted to pattern data forming as for a plurality of repeat pattern areas. Further, a plurality of repeat pattern areas must not be in the same size with each other. Even if the shape and the position of the design pattern in each repeat pattern area differs from each other, each embodiment of the present invention can be adopted.

As set forth hereinabove, according to the present invention, a repeat pattern area is all formed by the array of single repeat unit or several kinds of repeat units and each repeat unit is exposed at once with a cell projection mask, thereby reducing the number of shots, so to improve throughput.

Further, according to the present invention, every pattern data is formed in the whole repeat pattern area by the partial batch exposure, thereby making the shape and the position of the pattern data uniform, so to improve reliability and yield of an integrated circuit, compared with the conventional art using several types of exposure methods.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A pattern lithography method for forming pattern data of an integrated circuit through exposure with a charged particle beam, comprising the steps of:

a step of extracting a repeat pattern area to be formed by the same repeated patterns, from the pattern data, based on design data of the integrated circuit;

a step of extracting pattern data and array data of the minimum unit of the repeated patterns in the repeat pattern area;

a step of generating repeat unit candidates formed by the array of a plurality of the minimum repeat units, based on the pattern data and the array data;

a step of deciding a single repeat unit or a plurality of repeat units for covering the whole repeat pattern area, from the repeat unit candidate group generated by said repeat unit candidate generating step; and a step of manufacturing a cell projection mask for use in partial batch exposure for the repeat pattern area, correspondingly to the repeat unit decided by said repeat unit deciding step.

2. A pattern lithography method as set forth in claim 1, wherein said repeat unit candidate generating step generates a repeat unit so that the array number of the minimum repeat units in the repeat pattern area can be divisible by the array number of the minimum repeat units within the same repeat unit.

3. A pattern lithography method as set forth in claim 1, wherein said repeat unit candidate generating step generates a repeat unit so that the array number of the minimum repeat units in the repeat pattern area can be divisible by the array number of the minimum repeat units within the same repeat unit, and said repeat unit deciding step decides, as the repeat unit, such a repeat unit candidate as is of the largest size within the size allowed to form the cell projection mask, out of the repeat unit candidate group generated by said repeat unit candidate generating step.

4. A pattern lithography method as set forth in claim 1, wherein said repeat unit deciding step including a step of deciding, as a first repeat unit, such a repeat unit candidate as is of the largest size within the size allowed to form the cell projection mask, out of the repeat unit candidate group generated by said repeat unit candidate generating step, and a step of deciding, as a second repeat unit, such a repeat unit candidate having the size capable of being arrayed in the remaining area if there leaves a remaining area after the array of the first repeat units and having a proper shape lest it should leave a remaining area where the repeat unit cannot be arrayed.

5. A pattern lithography method as set forth in claim 1, wherein said repeat unit deciding step including a step of deciding, as a first repeat unit, such a repeat unit candidate as is of the largest size within the size allowed to form the cell projection mask, out of the repeat unit candidate group generated by said repeat unit candidate generating step, and a step of deciding, as a second repeat unit, such a repeat unit candidate having the size capable of being arrayed in the remaining area if there leaves a remaining area after the array of the first repeat units and having a proper shape lest it should leave a remaining area where the repeat unit cannot be arrayed, and a step of deciding, as a third repeat unit, such a repeat unit candidate that the array number of the minimum repeat units in the repeat pattern area can be divisible by the array number of the minimum repeat units within the same repeat unit candidate, and that is of the largest size within the size allowed to form the cell projection mask, out of the repeat unit candidate group generated by said repeat unit candidate generating step, wherein further including, between said repeat unit deciding step and said cell projection mask manufacturing step, a step of making a comparison between the array number of the repeat units in the repeat pattern area with the first and second repeat unit and the array number of the repeat units in the repeat pattern area with the third repeat unit and selecting the repeat pattern having the smaller number.

* * * * *